United States Patent
Deak et al.

(10) Patent No.: US 12,270,871 B2
(45) Date of Patent: Apr. 8, 2025

(54) ELECTROMECHANICAL MODULATION MAGNETORESISTIVE ROTARY MAGNETIC FIELD PROBE

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 228 days.

(21) Appl. No.: 17/997,626

(22) PCT Filed: Apr. 16, 2021

(86) PCT No.: PCT/CN2021/087772
§ 371 (c)(1),
(2) Date: Oct. 31, 2022

(87) PCT Pub. No.: WO2021/218668
PCT Pub. Date: Nov. 4, 2021

(65) Prior Publication Data
US 2023/0168320 A1 Jun. 1, 2023

(30) Foreign Application Priority Data
Apr. 30, 2020 (CN) .......................... 202010366572.7

(51) Int. Cl.
*G01R 33/09* (2006.01)
*G01R 33/00* (2006.01)

(52) U.S. Cl.
CPC ....... *G01R 33/098* (2013.01); *G01R 33/0005* (2013.01)

(58) Field of Classification Search
CPC .............. G01R 33/098; G01R 33/0005; G01R 33/0041; G01R 33/007; G01R 33/09
(Continued)

(56) References Cited

U.S. PATENT DOCUMENTS

| 4,274,053 A | 6/1981 | Ito et al. |
| 4,319,188 A | 3/1982 | Ito et al. |

(Continued)

FOREIGN PATENT DOCUMENTS

| CN | 101149424 A | 3/2008 |
| CN | 103630853 A | 3/2014 |

(Continued)

OTHER PUBLICATIONS

"Chinese Application No. 202010366572.7, First Patent Search dated Dec. 17, 2021", (Dec. 17, 2021), 2 pgs.

(Continued)

*Primary Examiner* — Giovanni Astacio-Oquendo
(74) *Attorney, Agent, or Firm* — Schwegman Lundberg & Woessner, P.A.

(57) ABSTRACT

A magnetoresistive magnetic field probe with rotating electromechanical modulator (1) comprises: a bulk cylindrical base (11), wherein the bulk cylindrical base (11) has a cavity structure, and a center axis of the bulk cylindrical base (11) overlaps with a z-axis of a cylindrical coordinate system; a first magnetic tile (12) and a second magnetic tile (13) attached to an outer side wall of the bulk cylindrical base (11); and a magnetoresistive sensor (14) and a reference signal generator (15) located on the center axis of the bulk cylindrical base (11). During operation, the bulk cylindrical base (11) rotates about the z-axis at a frequency f, and the first magnetic tile (12) and the second magnetic tile (13) modulate an external magnetic field into a sensed magnetic field having a frequency 2f, and a measurement signal having a frequency 2f is output via the magnetoresistive sensor (14). The reference signal generator (15) outputs a reference signal having a frequency 2f. The reference signal and the measurement signal are demodulated by an external processing circuit (4) to output a magnetic field value, so as (Continued)

to provide a measurement of the external magnetic field with superior signal-to-noise ratio. Through adding a detachable rotating sleeve to the magnetoresistive sensor (14), superior signal-to-noise ratio measurement of the external magnetic fields can be realized. This invention is small in size with a simple structure, and the complexity of the process is also greatly reduced, enabling lower cost.

13 Claims, 8 Drawing Sheets (58) Field of Classification Search
USPC .................................... 324/252, 244, 200
See application file for complete search history.

(56) References Cited

U.S. PATENT DOCUMENTS

| | | | |
|---|---|---|---|
| 10,690,515 | B2 | 6/2020 | Deak et al. |
| 10,866,287 | B1* | 12/2020 | Lassalle-Balier .... G01R 33/098 |
| 2010/0231211 | A1 | 9/2010 | Edelstein et al. |
| 2015/0309128 | A1* | 10/2015 | Raberg ............... G01R 33/0041 |
| | | | 324/252 |
| 2017/0356764 | A1 | 12/2017 | Deak et al. |
| 2019/0157995 | A1 | 5/2019 | Mori |
| 2020/0012006 | A1 | 1/2020 | Strachen et al. |
| 2020/0217908 | A1 | 7/2020 | Deak et al. |
| 2021/0096196 | A1* | 4/2021 | Cai ....................... G01R 33/098 |
| 2021/0372821 | A1* | 12/2021 | Schmitt .................. G01D 18/00 |
| 2023/0273276 | A1* | 8/2023 | Deak .................... G01R 33/091 |
| | | | 324/252 |
| 2024/0151786 | A1* | 5/2024 | Satz ................... G01R 33/0023 |

FOREIGN PATENT DOCUMENTS

| | | |
|---|---|---|
| CN | 104197827 | 12/2014 |
| CN | 107037382 A | 8/2017 |
| CN | 107422283 A | 12/2017 |
| CN | 207963906 U | 10/2018 |
| CN | 109556647 A | 4/2019 |
| CN | 109799469 A | 5/2019 |
| CN | 111413654 A | 7/2020 |
| CN | 111505545 A | 8/2020 |
| CN | 111537924 A | 8/2020 |
| JP | H0914990 A | 1/1997 |
| WO | WO-2021218668 A1 | 11/2021 |

OTHER PUBLICATIONS

"Chinese Application No. 202010366572.7, Notification to Grant Patent Right for Invention dated Jan. 11, 22", (Jan. 11, 2022), 3 pgs.
"International Application No. PCT/CN2021/087772, International Search Report and Written Opinion mailed Jul. 8, 2021", (Jul. 8, 2021), 14 pgs.

* cited by examiner

ELECTROMECHANICAL MODULATION MAGNETORESISTIVE ROTARY MAGNETIC FIELD PROBE

PRIORITY CLAIM TO RELATED APPLICATIONS

This application is a U.S. national stage filing under 35 U.S.C. § 371 from International Application No. PCT/CN2021/087772, filed on 16 Apr. 2021, and published as WO2021/218668 on Apr. 11, 2021, which claims the benefit under 35 U.S.C. 119 to Chinese Application No. 202010366572.7, filed on 30 Apr. 2020, the benefit of priority of each of which is claimed herein, and which applications and publication are hereby incorporated herein by reference in their entirety.

TECHNICAL FIELD

Embodiments of this invention relate to magnetoresistive sensor technology, and in particular to a magnetoresistive magnetic field probe with rotating electromechanical modulator.

BACKGROUND

Magnetoresistive sensors have 1/f noise during normal use, and reducing the noise of magnetoresistive sensors and developing low-noise magnetoresistive sensors are of great importance to improve the accurate measurement of magnetic signals.

In general, magnetoresistive sensors have high 1/f noise at low frequencies, while at high frequencies, thermal noise dominates, and the noise energy density thereof is much lower than the noise energy density at low frequencies. Therefore, in most cases, the current choice is to pre-modulate a magnetic signal into a high frequency magnetic field and then measure it through a magnetoresistive sensor so as to output a high frequency voltage signal, which is later demodulated, so that the purpose of moving the magnetic signal measurement from a low frequency region to a high frequency region can be achieved, which reduces the 1/f noise energy density.

However, the existing high frequency magnetic signal measurement devices make the complexity and size of magnetoresistive sensors increase greatly, as well as the process complexity.

U.S. Patent Application No. US/365,398 discloses a magnetoresistive sensor method and device for modulating the magnetic flux sensed by a magnetic sensor. The application includes at least one magnetic sensor attached to a base structure, a rotating member, and at least one flux concentrator mounted on the rotating member, wherein as the rotating member rotates, the at least one flux concentrator shields the magnetic sensor, thereby modulating the output of the at least one magnetic sensor. The application uses a TMR sensor chip to implement a two-axis sensor, whose structural size is complex.

SUMMARY OF THE INVENTION

Embodiments of this invention provide a magnetoresistive magnetic field probe with rotating electromechanical modulator to solve the problem of complex measurement structures.

Embodiments of this invention provide a magnetoresistive magnetic field probe with rotating electromechanical modulator, comprising:

a bulk cylindrical base, wherein the bulk cylindrical base has a cavity structure and has cylindrical coordinates of $(r(r=R_0), \alpha[0,360°], z[L_0,L_0+L])$, and a center axis of the bulk cylindrical base overlaps with a z-axis of a cylindrical coordinate system;

a first magnetic tile and a second magnetic tile attached to an outer side wall of the bulk cylindrical base, wherein the first magnetic tile has cylindrical coordinates of $(r[R_0,R_0+H_S], \alpha[\Phi,180°-\Phi], z[L_0+L_1,L_0+L_1+L_S])$, and the second magnetic tile has cylindrical coordinates of $(r[R_0,R_0+H_S], \alpha[180°+\Phi,360°-\Phi], z[L_0+L_1, L_0+L_1+L_S])$, $0<\Phi<90°$; and a magnetoresistive sensor and a reference signal generator located on the center axis of the bulk cylindrical base, wherein the magnetoresistive sensor has cylindrical coordinates of $(r(r=0), \alpha(\alpha=0), z(z=L_m))$, $L_0+L_1<L_m<L_0+L_1+L_S$, wherein during operation, the bulk cylindrical base rotates about the z-axis at a frequency f, and the first magnetic tile and the second magnetic tile modulate an external magnetic field into a sensed magnetic field having a frequency 2f, and a measurement signal having a frequency 2f is output via the magnetoresistive sensor, and the reference signal generator outputs a reference signal having a frequency 2f, and the reference signal and the measurement signal are demodulated by an external processing circuit to output a magnetic field value so as to provide a measurement of the external magnetic field with superior signal-to-noise ratio.

In the embodiments of this invention, during operation, the bulk cylindrical base rotates about the z-axis at a frequency f, and the first magnetic tile and the second magnetic tile modulate an external magnetic field into a sensed magnetic field having a frequency 2f, and a measurement signal having a frequency 2f is output via the magnetoresistive sensor, and the reference signal generator outputs a reference signal having a frequency 2f, and the reference signal and the measurement signal are demodulated by an external processing circuit to output a magnetic field value so as to provide a measurement of the external magnetic field with superior signal-to-noise ratio.

In the embodiments of this invention, the bulk cylindrical base rotates about the z-axis at a frequency f, and the synchronous rotation of two mutually insulated cylindrical surface electrodes can modulate the stationary magnetic field between them into a high frequency magnetic field, which can greatly reduce the noise used in its magnetoresistive sensors. The magnetic field probe has a simple fabrication structure, and through adding a detachable rotating sleeve to the magnetoresistive sensor, superior signal-to-noise ratio measurement of the external magnetic fields can be realized. This invention is small in size with a simple structure, and the complexity of the process is also greatly reduced, enabling lower cost.

BRIEF DESCRIPTION OF THE DRAWINGS

In order to more clearly illustrate the technical solutions in the embodiments of this invention or the prior art, a brief description of the accompanying drawings that need to be used in the description of the embodiments or the prior art will be given below. It is obvious that although the accompanying drawings in the following description are some specific embodiments of this invention, those skilled in the art can expand and extend to other structures and drawings according to the basic concepts of device structures, driving methods and manufacturing methods disclosed and suggested by the embodiments of this invention, which are undoubtedly within the scope of the claims of this invention.

DETAILED DESCRIPTION

In order to make the purpose, technical solutions and advantages of this invention clearer, the technical solutions of this invention will be described clearly and completely by way of implementations hereinafter with reference to the accompanying drawings in the embodiments of this invention, and it is clear that the described embodiments are part of the embodiments of this invention, but not all of them. Based on the basic concepts revealed and suggested by the embodiments in this invention, all other embodiments obtained by those skilled in the art fall within the scope of protection of this invention.

Figure 1:
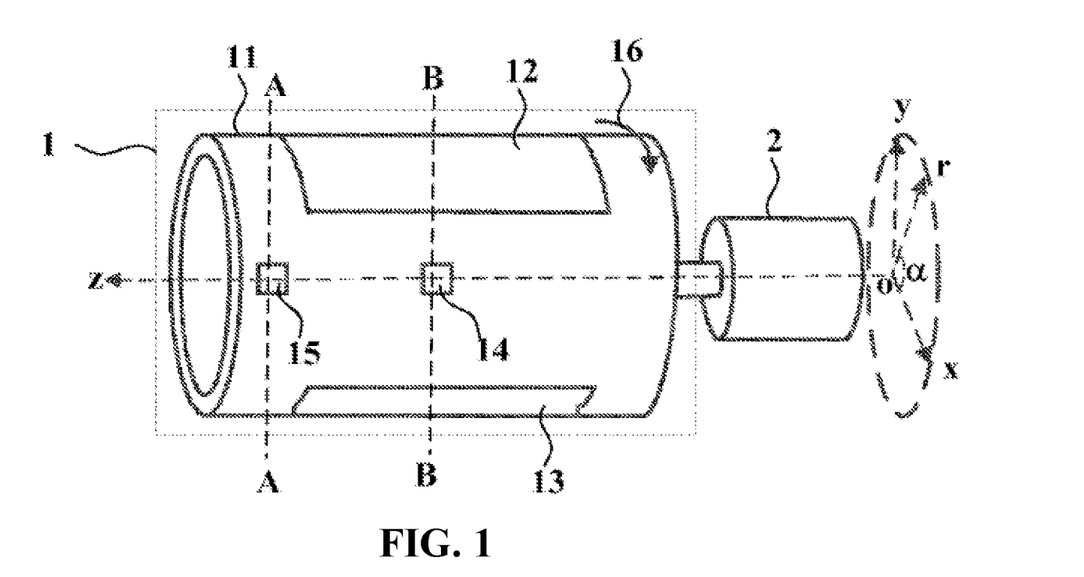
FIG. 1 is a schematic diagram of a magnetoresistive magnetic field probe with rotating electromechanical modulator provided by an embodiment of this invention.
Figure 2:
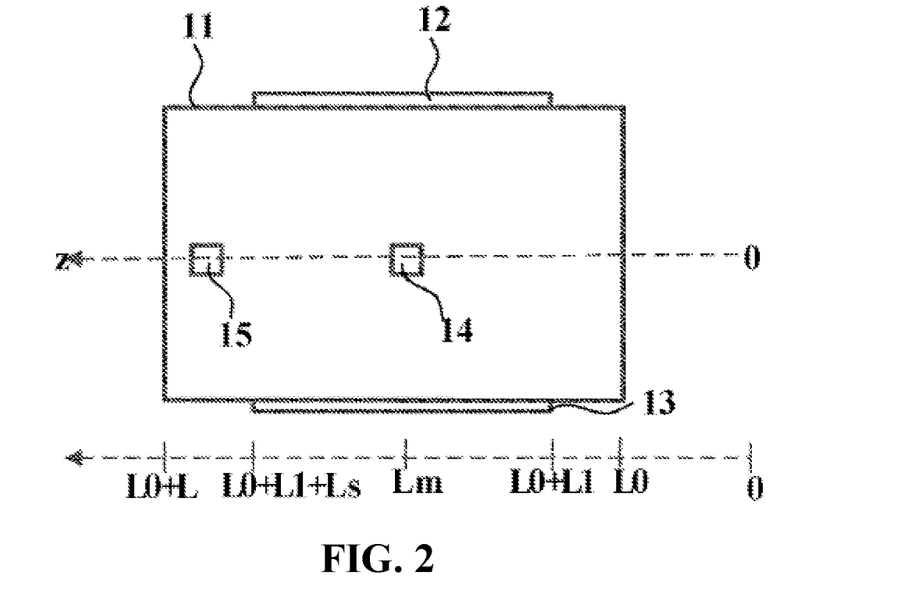
FIG. 2 is a cross-sectional view of FIG. 1 along z=0.
Figure 3:
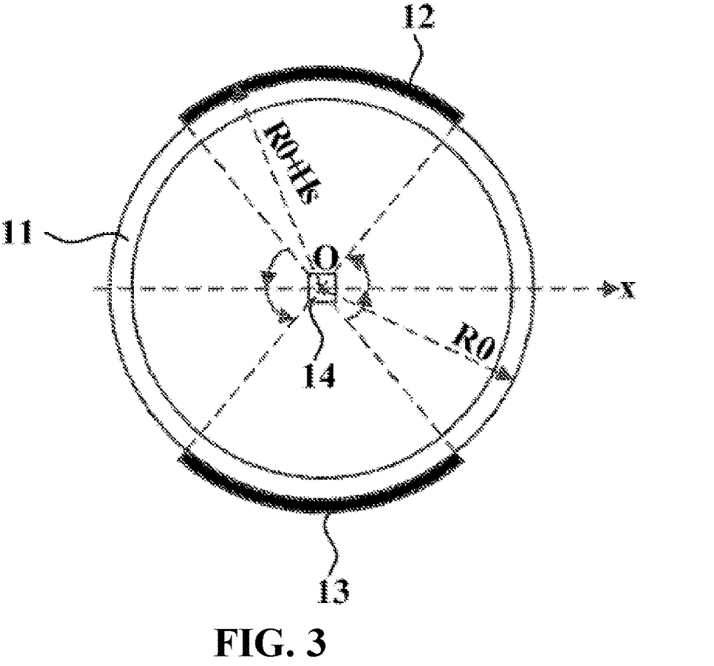
FIG. 3 is a cross-sectional view of FIG. 1 along B-B.

Referring to FIG. 1, a schematic diagram of a magnetoresistive magnetic field probe with rotating electromechanical modulator provided by an embodiment of this invention is shown, FIG. 2 is a cross-sectional view of FIG. 1 along z=0, and FIG. 3 is a cross-sectional view of FIG. 1 along B-B. The magnetoresistive magnetic field probe with rotating electromechanical modulator 1 provided in this embodiment comprises: a bulk cylindrical base 11, wherein the bulk cylindrical base 11 has a cavity structure and has cylindrical coordinates of $(r(r=R_0), \alpha[0,360°], z[L_0, L_0+L])$, and a center axis of the bulk cylindrical base 11 overlaps with a z-axis of a cylindrical coordinate system; a first magnetic tile 12 and a second magnetic tile 13 attached to an outer side wall of the bulk cylindrical base 11, wherein the first magnetic tile 12 has cylindrical coordinates of $(r[R_0, R_0+H_S], \alpha[\Phi, 180°-\Phi], z[L_0+L_1, L_0+L_1+L_S])$, and the second mag-netic tile 13 has cylindrical coordinates of $(r[R_0, R_0+H_S], \alpha[180°+\Phi, 360°-\Phi], z[L_0+L_1, L_0+L_1+L_S])$, $0<\Phi<90°$; and a magnetoresistive sensor 14 and a reference signal generator 15 located on the center axis of the bulk cylindrical base 11, wherein the magnetoresistive sensor 14 has cylindrical coordinates of $(r(r=0), \alpha(\alpha=0), z(z=L_m))$, $L_0+L_1<L_m<L_0+L_1+L_S$; during operation, the bulk cylindrical base 11 rotates about the z-axis at a frequency f, the first magnetic tile 12 and the second magnetic tile 13 modulate an external magnetic field into a sensed magnetic field having a frequency 2f, a measurement signal having a frequency 2f is output via the magnetoresistive sensor 14, the reference signal generator 15 outputs a reference signal having a frequency 2f, and the reference signal and the measurement signal are demodulated by an external processing circuit to output a magnetic field value so as to provide a measurement of the external magnetic field with superior signal-to-noise ratio.

In this embodiment, the bulk cylindrical base 11 has a cavity structure, that is, the shape of the structure of the bulk cylindrical base 11 is annular, and the interior of the cylinder has a hollow structure. An xyz coordinate system is established with the center axis of the bulk cylindrical base 11 as the z=0 axis, and the coordinate points are denoted by cylindrical coordinates (r, α, z), where r denotes the vertical distance from the z-axis, and α denotes the included angle between r and the x-axis when r is on the x-y plane. The bulk cylindrical base 11 has cylindrical coordinates of $(r(r=R_0), \alpha[0,360°], z[L_0, L_0+L])$, that is, an annular straight bulk cylinder with a bottom face outer circle radius of $r=R_0$ and a height of $z=L_0$ to $z=L_0+L$ is created with z=0 as the center axis, where the thickness of the annular side wall of the bulk cylindrical base 11 is not specifically limited. Optionally, the bulk cylindrical base 11 is made of a non-magnetic material. For example, the material of the bulk cylindrical base 11 may be optionally any non-magnetic material of plastic, ceramic, metal, or polymer.

In this embodiment, a first magnetic tile 12 and a second magnetic tile 13 are attached to an outer side wall of the bulk cylindrical base 11, wherein the first magnetic tile 12 has cylindrical coordinates of $(r[R_0, R_0+H_S], \alpha[\Phi, 180°-\Phi], z[L_0+L_1, L_0+L_1+L_S])$, and the second magnetic tile 13 has cylindrical coordinates of $(r[R_0, R_0+H_S], \alpha[180°+\Phi, 360°-\Phi], z[L_0+L_1, L_0+L_1+L_S])$, $0<\Phi<90°$, and the first magnetic tile 12 and the second magnetic tile 13 both have a cylindrical surface shape. The inner radius of this cylindrical surface is $R_0$, which indicates that the magnetic tile is attached to the surface of the outer side wall of the bulk cylindrical base 11, and the outer radius of this cylindrical surface is $R_0+H_S$, which can be understood as the thickness of the magnetic tile being $H_S$; the projection of the cylindrical surface of the first magnetic tile 12 on the x-y plane is a circular arc from $\Phi$ to $180°-\Phi$, and the projection of the cylindrical surface of the second magnetic tile 13 on the x-y plane is a circular arc from $180°+\Phi$ to $360°-\Phi$; and the projection of this cylindrical surface on the z-axis is a line segment from $L_0+L_1$ to $L_0+L_1+L_S$. Optionally, both the first magnetic tile 12 and the second magnetic tile 13 are made of soft magnetic alloy materials. Obviously, the first magnetic tile 12 and the second magnetic tile 13 are provided symmetrically along the z=0 axis, and the bulk cylindrical base 11 is made of a non-magnetic material, so the first magnetic tile 12 and the second magnetic tile 13 are provided in a mutually insulated manner, and the two mutually insulated cylindrical surface electrodes, i.e., the first magnetic tile 12 and the second magnetic tile 13, produce a constant electric field perpendicular to the cylindrical surface, and the two mutually insulated cylindrical surface electrodes, i.e., the first magnetic tile 12 and the second magnetic tile 13, also produce a stationary magnetic field, i.e., the external magnetic field.

In this embodiment, the magnetoresistive magnetic field probe with rotating electromechanical modulator further includes: a magnetoresistive sensor 14 and a reference signal generator 15 located on the center axis of the bulk cylindrical base 11, wherein the magnetoresistive sensor 14 has cylindrical coordinates of (r(r=0), α(α=0), z(z=$L_m$)), $L_0+L_1<L_m<L_0+L_1+L_S$, that is, the projection of the magnetic tile on the z-axis covers the magnetoresistive sensor 14. The reference signal generator 15 is used to detect the rotational angular displacement of the bulk cylindrical base 11 and trigger the reference signal.

In this embodiment, during the operation phase, the bulk cylindrical base 11 rotates about the center axis of z=0 in the direction of rotation as indicated by the arrow 16, and the rotation of the bulk cylindrical base 11 drives the first magnetic tile 12 and the second magnetic tile 13 on it to rotate synchronously, then the two mutually insulated cylindrical surface electrodes, i.e., the first magnetic tile 12 and the second magnetic tile 13, form one rotating electrode and rotate at a frequency f. When the bulk cylindrical base 11 rotates about the z=0 axis at the frequency f, the stationary magnetic field between the first magnetic tile 12 and the second magnetic tile 13 attached to the bulk cylindrical base 11 changes periodically, thus modulating the external magnetic field into a sensed magnetic field having a frequency 2f; the magnetoresistive sensor 14 detects the sensed magnetic field to obtain a measurement signal having a frequency 2f and outputs this measurement signal having the frequency 2f, the reference signal generator 15 detects the rotational angular displacement of the bulk cylindrical base 11 to obtain a reference signal having a frequency 2f and outputs this reference signal having the frequency 2f, and both the reference signal and the measurement signal are output to an external processing circuit. The external processing circuit demodulates the received reference signal and measurement signal to obtain a magnetic field value and outputs this magnetic field value, thus enabling superior signal-to-noise ratio measurement of the external magnetic field.

Figure 4:
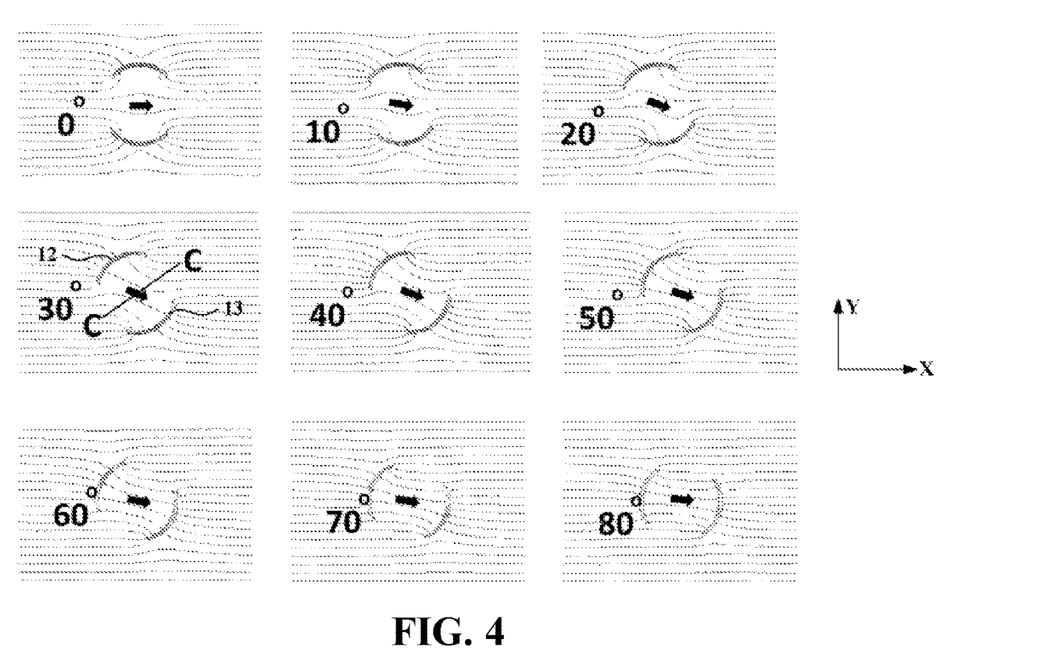
FIG. 4 is a distribution map of a magnetic field generated by a bulk cylindrical base at the position of a magnetoresistive sensor at different phase angles θ under an external magnetic field in the X-direction.

FIG. 4 illustrates a distribution map of a magnetic field generated by a bulk cylindrical base at the position of a magnetoresistive sensor at different phase angles θ under an external magnetic field in the X-direction. Optionally, the symmetry axis C-C for the first magnetic tile 12 and the second magnetic tile 13 denotes the phase position of the rotation of the bulk cylindrical base, and θ is the phase angle of the rotating position of the bulk cylindrical base relative to the X-direction, which may optionally be: θ=0°, θ=10°, θ=20°, θ=30°, θ=40°, θ=50°, θ=60°, θ=70°, and θ=80°. The arrow pointing direction denotes the direction of the magnetic field generated by the bulk cylindrical base at the position of the magnetoresistive sensor, and the included angle Φ between the direction of the magnetic field and the X-direction denotes the magnetic field direction angle. The direction of rotation of the bulk cylindrical base along the counterclockwise direction is defined as the positive direction. For example, if the first magnetic tile 12 and the second magnetic tile 13 are located in the +Y and −Y directions, respectively, the starting phase angle θ of the rotation of the bulk cylindrical base is 0, and the direction of the magnetic field at the position of the magnetoresistive sensor is the X direction, and the magnetic field direction angle Φ is defined as 0; when 0 is 10°, the magnetic field direction rotates clockwise and the magnetic field direction angle Φ is negative; and as θ goes from 0° to 30°, the amplitude of the value of Φ starts to increase, and then when 0 goes from 40° to 80°, the value of Φ starts to rotate in the counterclockwise direction and its amplitude decreases, and obviously when 0 is 90°, the value of Φ returns to 0°.

Figure 5A:
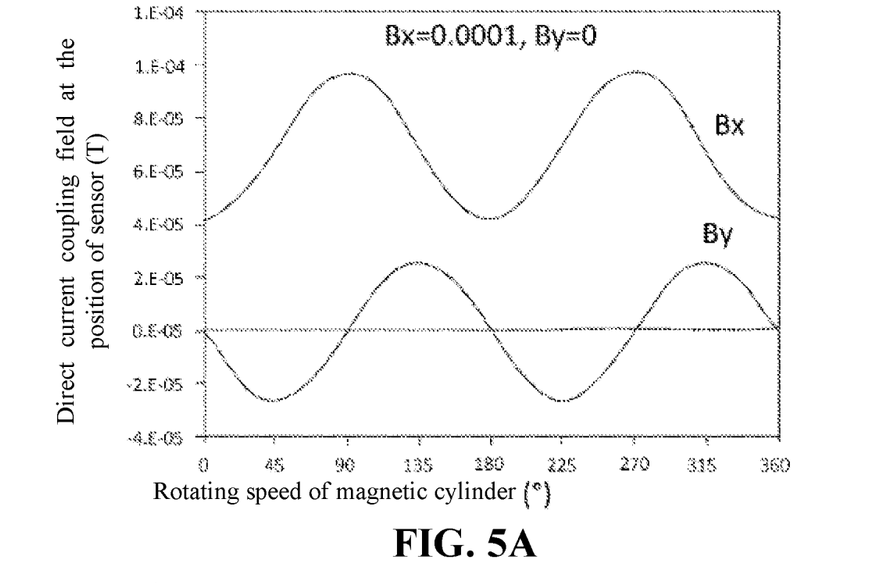
FIG. 5A is a schematic diagram of a magnetic field component of the magnetic field B at the position of the magnetoresistive sensor.
Figure 5B:
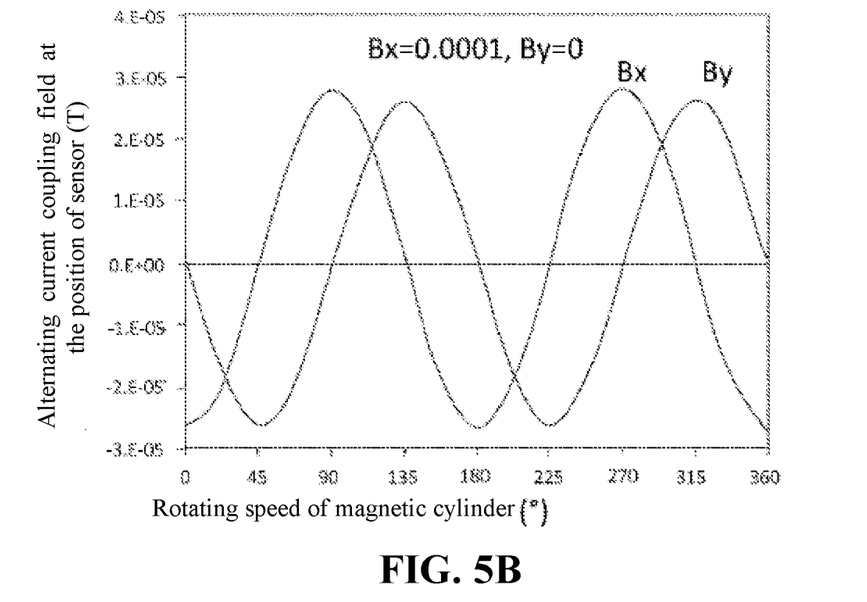
FIG. 5B is a diagram of the changes of an alternating current component with a rotating angle θ of the bulk cylindrical base.

FIG. 5A illustrates a schematic diagram of a magnetic field component of the magnetic field B at the position of the magnetoresistive sensor, and FIG. 5B illustrates a diagram of the changes of an alternating current component with a rotating angle θ of the bulk cylindrical base, where the direct current external magnetic field is 1G, and FIG. 5B illustrates the changes of the magnetic field after the direct current components are completely filtered out. It can be seen that in the range of θ from 0 to 360°, the X-direction magnetic field component Bx or the Y-direction magnetic field component By corresponding to the magnetic field B at the position of the magnetoresistive sensor contains two periods, that is, its frequency is 2f, where f is 2πω, ω is the rotating speed of the bulk cylindrical base, and f is the rotating frequency of the bulk cylindrical base. For By, its direct current component is 0, and for Bx, its direct current component is non-zero. In order to exclude the influence of the direct current components, a coupling capacitor can be used to connect to the signal output end of the magnetoresistive sensor to modulate Bx and By together to a 0 direct current magnetic field. It can be seen that the difference between the phases of Bx and By is 90°, the phase of Bx is 0, and the phase of By is 90°. By rotating the bulk cylindrical base, the direct current magnetic field H can be modulated into an alternating current magnetic field having a frequency that is 2 times the frequency f. It can also be seen that if the change of one of the magnetic field components, Bx, with the rotating angle θ is known, the change of the other magnetic field component, By, with the rotating angle θ can be obtained, i.e., by simply adjusting the starting phase of Bx to +90°. Conversely, if the change of By with the rotating angle θ is known, then by adjusting its starting phase to −90°, the change of Bx with the rotating angle θ can be obtained.

Optionally, the magnetoresistive sensor is a uniaxial linear sensor or a biaxial linear sensor, wherein the uniaxial linear sensor has magnetic field sensitive direction cylindrical coordinates of (r, $α_1(α_1=β$ or $β+90°)$, z(z=$L_m$)), and the biaxial linear sensor has magnetic field sensitive direction cylindrical coordinates of (r, $α_2(α_2=β)$ and $α_3(α_3=β+90°)$, z(z=$L_m$)), $0≤β<270°$. Optionally, the magnetoresistive sensor is a tunneling magnetoresistive (TMR) sensor, where the TMR sensor may be a biaxial linear sensor, in which case the Bx and By magnetic field components can be measured at the same time; and the TMR sensor may also be a uniaxial linear sensor, in which case one of the magnetic fields, Bx, can be measured, and then by shifting the phase by 90°, the other magnetic field component, By, can be obtained; alternatively, one of the magnetic fields, By, can be measured, and then by shifting the phase by −90°, the other magnetic field component, Bx, can be obtained.

Figure 6:
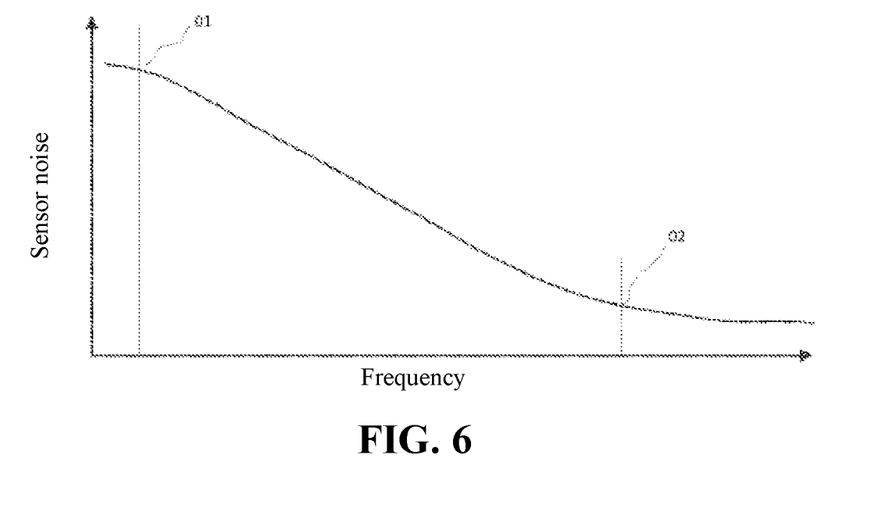
FIG. 6 is a diagram of the white noise spectrum of the magnetoresistive sensor.

FIG. 6 illustrates a diagram of the white noise spectrum of the magnetoresistive sensor. Since white noise has a 1/f feature, that is, its noise is large at low frequency 01, while its noise decreases significantly at high frequency 02, modulation of the measured magnetic field to the frequency 2f can be achieved by introducing the high frequency f rotation of the rotating magnetic cylinder, thus achieving the purposes of reducing white noise and improving signal-to-noise ratio.

In the embodiments of this invention, during operation, the bulk cylindrical base rotates about the z-axis at a frequency f, and the first magnetic tile and the second magnetic tile modulate an external magnetic field into a sensed magnetic field having a frequency 2f, and a measurement signal having a frequency 2f is output via the magnetoresistive sensor, the reference signal generator outputs a reference signal having a frequency 2f, and the reference signal and the measurement signal are demodulated by an external processing circuit to output a magnetic field value so as to provide a measurement of the external magnetic field with superior signal-to-noise ratio. In the embodiments of this invention, the bulk cylindrical base rotates about the z-axis at a frequency f, and the synchronous rotation of two mutually insulated cylindrical surface electrodes can modulate the stationary magnetic field between them into a high frequency magnetic field, which can greatly reduce the noise used in its magnetoresistive sensors. The magnetic field probe has a simple fabrication structure, and through adding a detachable rotating sleeve to the magnetoresistive sensor, superior signal-to-noise ratio measurement of the external magnetic fields can be realized. This invention is small in size with a simple structure, and the complexity of the process is also greatly reduced, enabling lower cost.

Figure 7:
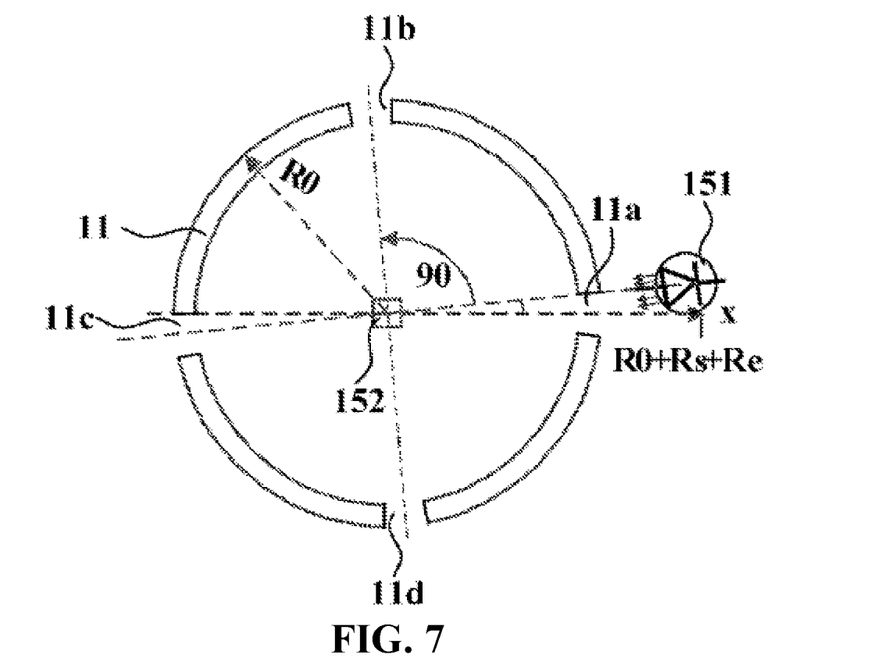
FIG. 7 is a cross-sectional view of FIG. 1 along A-A.

Exemplarily, on the basis of the above technical solution, as shown in FIG. 7, optionally, a side wall of the bulk cylindrical base 11 has 4 light-incident holes 11a to 11d, wherein the 4 light-incident holes 11a to 11d have different cylindrical coordinates that are (r(r=$R_0$), α(α=θ,θ+90°,θ+180°,θ+270°), z(z=$L_{e1}$ or z=$L_{e2}$)), wherein $L_0$<$L_{e1}$<$L_0$+$L_1$, $L_0$+$L_1$+$L_S$<$L_{e2}$<$L_0$+L, 0<θ<90°; the reference signal generator 15 comprises: a light emitting element 151 located outside the outer side wall of the bulk cylindrical base 11, wherein the light emitting element 151 has cylindrical coordinates of (r(r=$R_0$+$h_S$+$h_e$), α(α=θ or θ+90° or θ+180° or θ+270°), z(z=$L_{e1}$ or z=$L_{e2}$)); and a photo detector 152 and a logic trigger circuit (not shown) located on the center axis of the bulk cylindrical base 11, wherein the photo detector 152 has cylindrical coordinates of (r(r=0), α(α=0), z(z=$L_{e1}$ or z=$L_{e2}$)); during operation, the bulk cylindrical base 11 rotates about the z-axis at the frequency f, and when light emitted from the light emitting element 151 is incident into the 4 light-incident holes 11a to 11d in sequence, the photo detector 152 detects the incident light from the light emitting element 151 and triggers the logic trigger circuit to output the reference signal having the frequency 2f. Here, FIG. 7 is a cross-sectional view of FIG. 1 along A-A.

In this embodiment, the 4 light-incident holes 11a to 11d are through-holes penetrating the side wall of the bulk cylindrical base 11. Optionally, the light-incident hole 11a has cylindrical coordinates of (r(r=$R_0$), α(α=θ), z(z=$L_{e1}$)), the light-incident hole 11b has cylindrical coordinates of (r(r=$R_0$), α(α=θ+90°), z(z=$L_{e1}$)), the light-incident hole 11c has cylindrical coordinates of (r(r=$R_0$), α(α=θ+180°), z(z=$L_{e1}$)), and the light-incident hole 11d has cylindrical coordinates of (r(r=$R_0$), α(α=θ+270°), z(z=$L_{e1}$)); optionally, the light emitting element 151 has cylindrical coordinates of (r(r=$R_0$+$h_S$+$h_e$), α(α=θ), z(z=$L_{e1}$)); and optionally, the photo detector 152 has cylindrical coordinates of (r(r=0), α(α=0), z(z=$L_{e1}$)). In other embodiments, it may also be optional that z=$L_{e2}$, and the light emitting element may optionally have cylindrical coordinates of (r(r=$R_0$+$h_S$+$h_e$), α(α=θ+90° or θ+180° or θ+270°). Optionally, the light emitting element is an LED, and the like, and in other embodiments, it may also optionally be other light emitting elements, such as a quantum dot light emitting element, and the like, which is not limited in this respect.

Optionally, in the initial state, the light emitted from the light emitting element 151 is incident onto the photo detector 152 via the light-incident hole 11a. During operation, the bulk cylindrical base 11 rotates about the z-axis at the frequency f, the light emitting element 151 are provided facing each of the 4 light-emitting holes 11a to 11d in sequence, where being provided facing each other means that the light emitting element 151, one of the light-emitting holes, and the photo detector 152 are located on the same straight line, so that the light emitted from the light emitting element 151 can pass through the light-incident hole it faces and then be incident onto the photo detector 152, and when detecting the incident light from the light emitting element 151, the photo detector 152 triggers the logic trigger circuit to output the reference signal having the frequency 2f.

Figure 8:
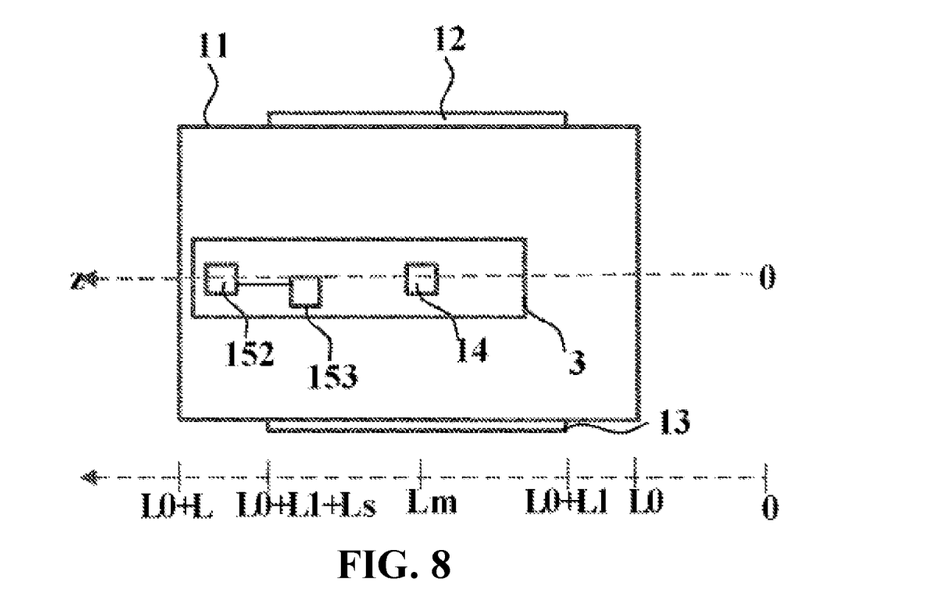
FIG. 8 is a schematic diagram of a magnetoresistive magnetic field probe with rotating electromechanical modulator provided by an embodiment of this invention.

As shown in FIG. 8, optionally, the magnetoresistive magnetic field probe with rotating electromechanical modulator further includes: a circuit board 3 located inside the bulk cylindrical base 11, wherein the photo detector 152 and the magnetoresistive sensor 14 are located on the circuit board 3. It can be understood that the magnetoresistive sensor 14, the logic trigger circuit 153, and the photo detector 152 are all located on the same circuit board 3, and the logic trigger circuit 153 is electrically connected to the photo detector 152, but the cylindrical coordinates of the logic trigger circuit 153 are not specifically limited.

Optionally, the reference signal is a high level signal or a low level signal; and when the photo detector does not detect light, the level of the reference signal output by the logic trigger circuit remains unchanged, and when the photo detector detects the incident light from the light emitting element, it triggers the logic trigger circuit so that the level of the reference signal output by the logic trigger circuit is switched.

It can be understood that if the bulk cylindrical base 11 rotates to the case where the light emitting element 151, one of the light-incident holes, and the photo detector 152 are provided facing each other, when detecting the incident light from the light emitting element 151, the photo detector 152 triggers the logic trigger circuit 153, so that the logic trigger circuit 153 switches the level of the reference signal; and if the bulk cylindrical base 11 rotates to the case where the light-incident hole and the photo detector 152 are intersected, the photo detector 152 does not detect light, then the logic trigger circuit 153 keeps the output level unchanged.

Specifically, during operation, the bulk cylindrical base 11 rotates about the z-axis at the frequency f, and the light emitted from the light emitting element 151 is incident into the light-incident hole 11a, then the photo detector 152 detects the incident light from the light emitting element 151 and converts the light signal into an electrical signal, so that it can detect the angular displacement of the bulk cylindrical base 11, and triggers the logic trigger circuit 153 for maintaining the outputting of the reference signal having the frequency 2f, where optionally, this reference signal is a high level signal; sequentially, the light emitted from the light emitting element 151 after rotation is incident into the light-incident hole 11b, and the photo detector 152 detects the incident light from the light emitting element 151 and triggers the logic trigger circuit 153 for switching to the outputting of a low level reference signal having a frequency 2f for continuous output; sequentially, the light emitted from the light emitting element 151 after rotation is incident into the light-incident hole 11c, and the photo detector 152 detects the incident light from the light emitting element 151 and triggers the logic trigger circuit 153 for switching to the outputting of a high level reference signal having a frequency 2f for continuous output; and sequentially, the light emitted from the light emitting element 151 after rotation is incident into the light-incident hole 11d, and the photo detector 152 detects the incident light from the light emitting element 151 and triggers the logic trigger circuit 153 for switching to the outputting of a low level reference signal having a frequency 2f for continuous output.

Obviously, whenever the logic trigger circuit 153 is triggered once, the level of the reference signal output by the logic trigger circuit 153 is switched once, and during the period between two triggers, the logic trigger circuit 153 keeps the outputting of a signal at the level of the previous trigger. It can be seen therefrom that the reference signal generator 15 outputs a reference signal having the frequency 2f that consists of a high level and a low level.

Figure 9:
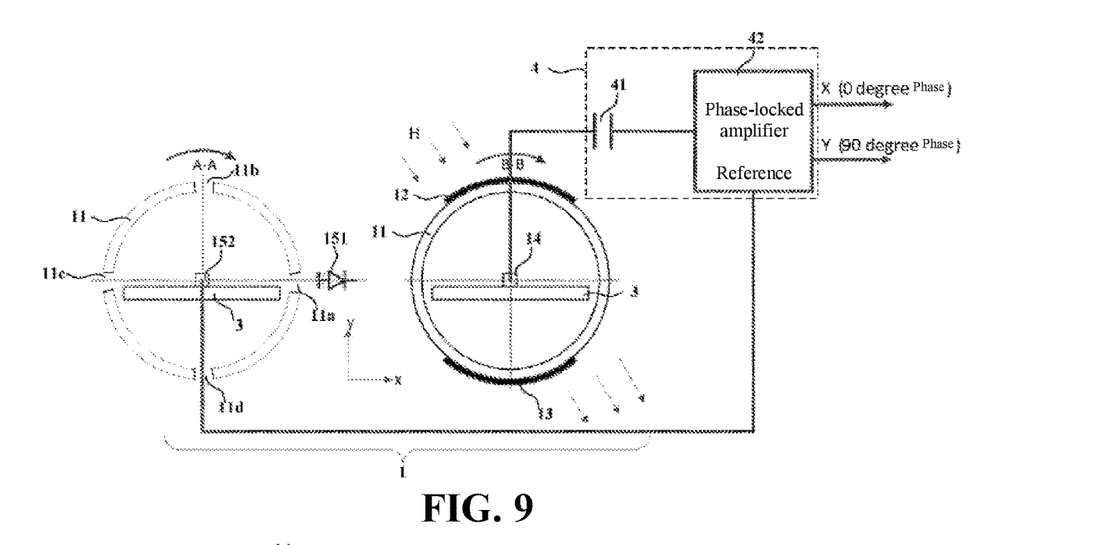
FIG. 9 is a diagram of the connection between a TMR magnetoresistive rotating magnetic field probe and an external processing circuit.
Figure 10:
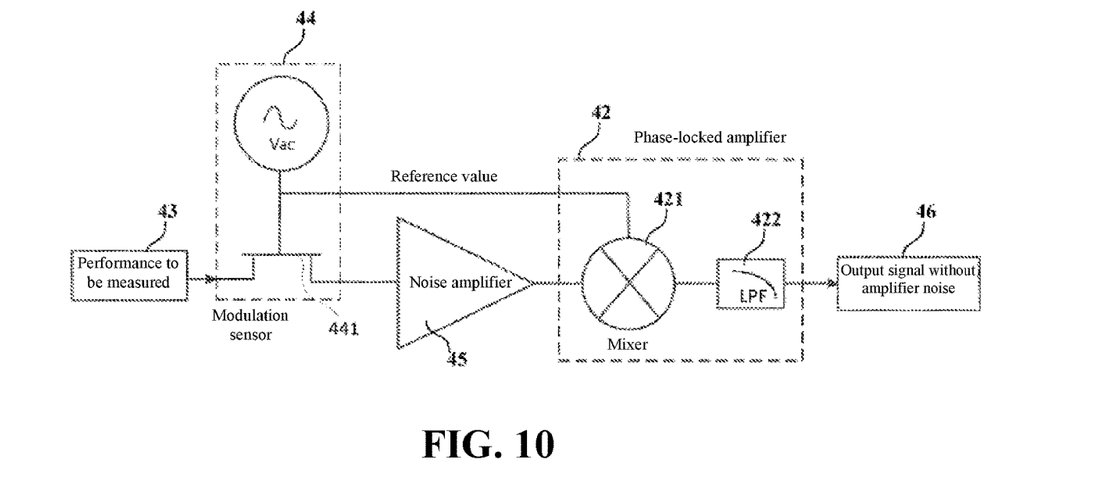
FIG. 10 is a structural diagram of the external processing circuit.

Exemplarily, on the basis of the above technical solution, as shown in FIGS. 9 and 10, the external processing circuit 4 comprises a capacitor 41 and a phase-locked circuit 42, the phase-locked circuit 42 comprising a mixer 421 and a low-pass filter 422, wherein a cut-off frequency of the low-pass filter 422 is less than a rotating frequency of the bulk cylindrical base 11; during operation, the measurement signal output by the magnetoresistive sensor 14 is coupled and output to the phase-locked circuit 42 via the capacitor 41.

As shown in FIG. 9, the magnetoresistive magnetic field probe with rotating electromechanical modulator 1 is electrically connected to the external processing circuit 4. The probe 1 has 4 light-incident holes 11a to 11d on the A-A cross-section, and a PD photo detector 152 is provided at the position of their common axis. The light emitted from the LED lamp 151 in the reference signal generator 15 enters the photo detector 152 through the light-incident holes, and then the photo detector 152 converts the frequency f of magnetic flux rotation into an electrical signal having a frequency that is 2 times the frequency, which is then input to the reference signal input end of the phase-locked amplifier 42 via the logic trigger circuit on the circuit board 3. The biaxial magnetoresistive sensor 14 of the probe 1 that is located on the common axis of the two magnetic tiles 12 and 13 in the B-B cross-section outputs an induced magnetic field signal having a frequency 2f, which is input as a measurement signal via the capacitor 41 to the measurement signal input end of the phase-locked amplifier 42. In this way, at the signal output end of the phase-locked amplifier 42, the X (0° phase output signal) magnetic field component output signal and Y (90° phase output signal) magnetic field component output signal are obtained, so that the vector value of the external magnetic field H is eventually obtained.

Optionally, the external processing circuit further comprises a preamplifier, wherein the preamplifier is provided between the capacitor and the phase-locked circuit. As shown in FIG. 10, the physical quantity to be measured 43, i.e., the measurement signal, passes through a modulation sensor 44 which includes a high frequency carrier signal source Vac and its corresponding sensor 441 to form a signal having a frequency f. The phase-locked circuit 42 may optionally be a phase-locked amplifier, including a mixer 421 and a low-pass filter 422. Signal amplification is performed by a noise amplifier 45 on the modulated signal output by the modulation sensor 44 to obtain a signal having a signal frequency of f, wherein the noise amplifier 45 is the preamplifier. Then, the high frequency carrier signal source Vac directly outputs a reference signal having the same frequency as the frequency f, and the reference signal is input into the mixer 421, and after being mixed, a high frequency signal and a low frequency signal are obtained, and the low frequency part is removed by the low-pass filter 422. Since no frequency shift will occur for the noise signal, the noise of the amplifier 45 is also filtered out, so that a high frequency output signal 46 without amplifier noise is finally obtained.

Figure 11:
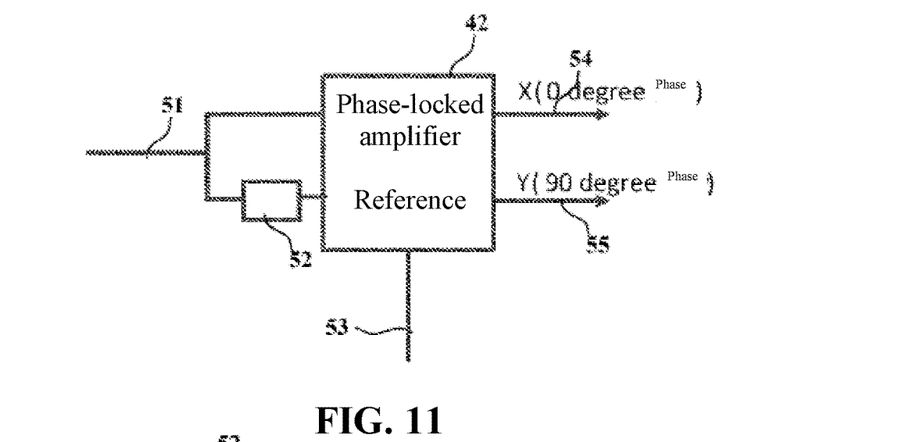
FIG. 11 is a schematic diagram of a phase-locked circuit.

Optionally, the external processing circuit further comprises a phase shifter; and the uniaxial linear sensor outputs two measurement signals, wherein one of the measurement signals is directly connected to the phase-locked circuit and the other is phase-shifted by 90 degrees by the phase shifter and then connected to the phase-locked circuit, the reference signal generator generates one reference signal, and the one reference signal and the two measurement signals are demodulated by the phase-locked circuit to output two output signals corresponding to magnetic field components of the external magnetic field. As shown in FIG. 11, a TMR uniaxial linear sensor is adopted, of which a signal output end 51 is divided into two branches, where one of the two branches is directly output to the phase-locked circuit 42 and the other is output to the phase-locked circuit 42 via the phase shifter 52, with an α2-α1 phase shift being produced. Assuming that an X-direction uniaxial linear sensor is adopted, the phase shift is 90°, and the reference signal 53 is constant, then the phase-locked circuit 42 outputs two signals 54 and 55, namely, Vx and Vy signals, then two components of the external magnetic field H can be obtained, respectively.

Figure 12:
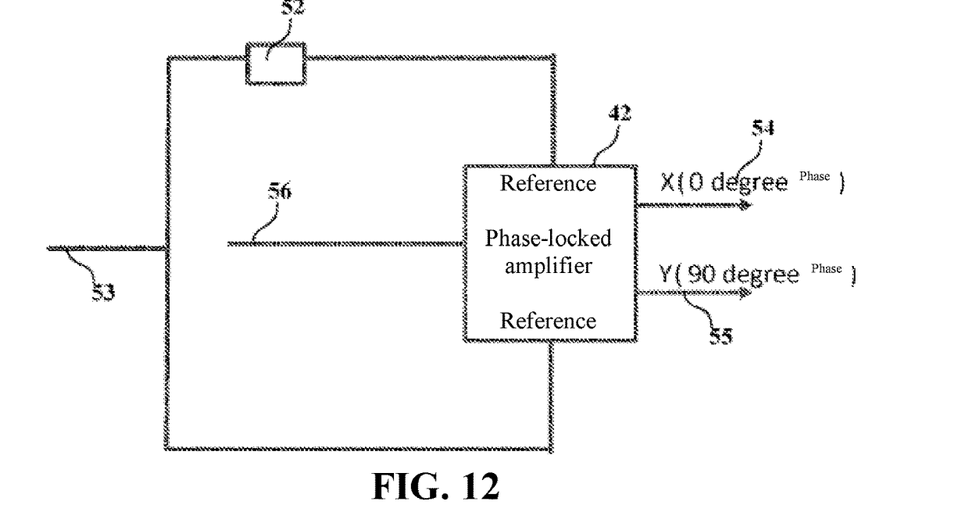
FIG. 12 is a schematic diagram of a phase-locked circuit.

Optionally, the external processing circuit further comprises a phase shifter; and the uniaxial linear sensor outputs one measurement signal and the reference signal generator generates two reference signals, wherein one of the reference signals is directly connected to the phase-locked circuit and the other is phase-shifted by 90 degrees by the phase shifter and then connected to the phase-locked circuit, and the one measurement signal and the two reference signals are demodulated by the phase-locked circuit to output two output signals corresponding to magnetic field components of the external magnetic field. As shown in FIG. 12, the reference signal 53 is divided into two channels, one of which is output directly to the phase-locked circuit 42 and the other goes through the phase shifter 52. Assuming that an X-direction uniaxial linear sensor is adopted, and the phase shift is 90, the two signals are mixed separately with the output signal 56 from the uniaxial linear sensor, and two signals 54 and 55, i.e., Vx and Vy, are output through the phase-locked circuit 42 to obtain two components of the external magnetic field H.

Optionally, two measurement signals output from the biaxial linear sensor are separately connected to the phase-locked circuit, the reference signal generator generates one reference signal, and the two measurement signals and the one reference signal are demodulated by the phase-locked circuit to output two output signals corresponding to magnetic field components of the external magnetic field.

Figure 13A:
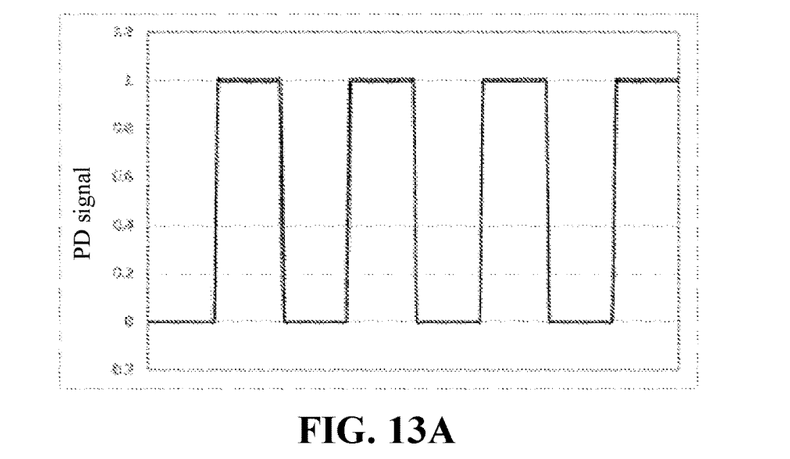
FIGS. 13A to 13C are diagrams of the operating time sequence of the TMR magnetoresistive rotating magnetic field probe.
Figure 13B:
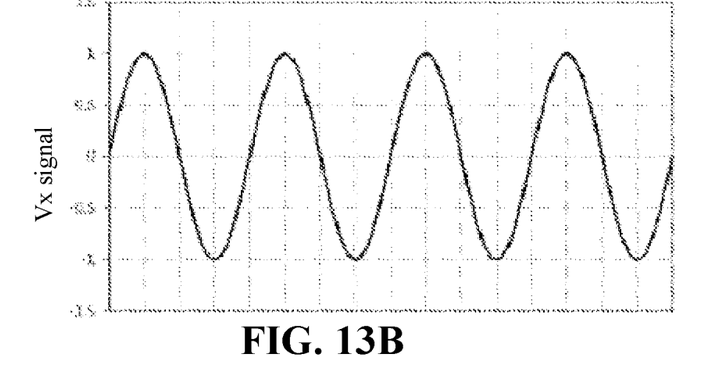
Figure 13C:
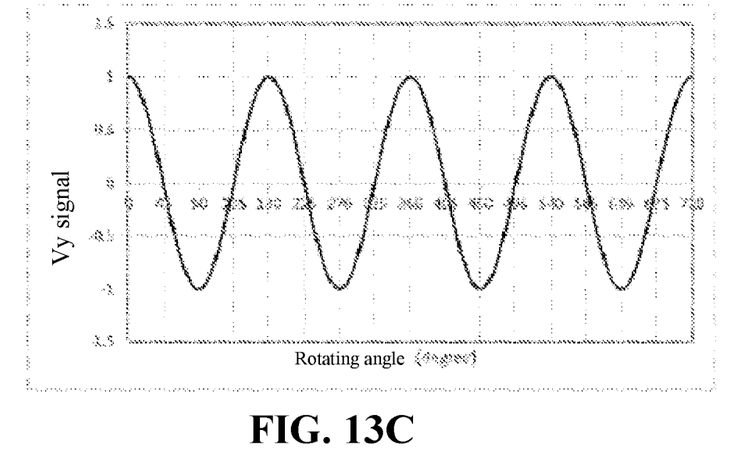

FIGS. 13A to 13C illustrate diagrams of the operating time sequence of the electromechanically modulated TMR sensor rotating probe. The signal from the photo detector is in the form of pulses, and the signal received by the photo detector is used to trigger the logic trigger circuit, so that the logic trigger circuit outputs high and low levels. Each time the photo detector receives LED incident light, the logic trigger circuit is triggered for high/low level inversion. For example, the logic trigger circuit outputs a low level at the beginning and remains to output a low level until the photo detector receives the LED incident light, and when the photo detector receives the LED incident light, it triggers the logic trigger circuit for switching to and keeping a high level, and until the photo detector receives the next LED incident light, the logic trigger circuit then switches from high level to low level again. FIG. 13A illustrates the high and low level signals output from the reference signal generator, FIG. 13B illustrates the x-directional magnetic field component Vx of the external magnetic field, and FIG. 13C illustrates the y-directional magnetic field component Vy of the external magnetic field. From the rotating angle coordinates, it can be seen that in the case where there are four incident holes, when the magnetic flux is rotated by 360°, the three signals have a period of 180°, that is, the frequency increases by 2 times, and the phase of the Vx signal is 0°, while the phase of the Vy signal is 90°, thus successfully shifting the TMR operating frequency to a high frequency, and based on the magnitudes of Vx and Vy, the magnetic field components of the actual external magnetic field can be solved, and finally the magnitude and direction of the external magnetic field H can be obtained.

Exemplarily, on the basis of the above technical solution, as shown in FIG. 1, optionally, the bulk cylindrical base 11 is driven to rotate by a magnetic shield motor 2, wherein the bulk cylindrical base 11 and the magnetic shield motor 2 are connected to each other by a non-magnetic transmission shaft 21. In other embodiments, it is also optional that the reference signal generator is provided directly on the outer side of the magnetic shield motor for use in measuring the angular displacement of the magnetic shield motor, which is not illustrated here. The magnetic shield motor is used to drive the bulk cylindrical base to rotate about the axis z=0, and the reference signal generator directly detects the rotational angular displacement of the magnetic shield motor and triggers the reference signal.

Figure 14:
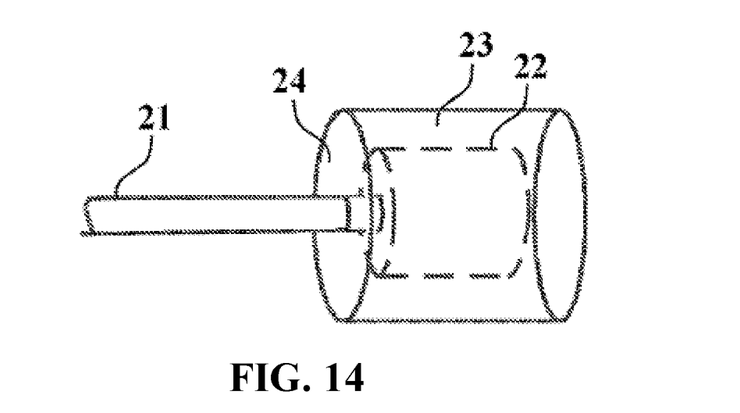
FIG. 14 is a structural diagram of a magnetic shield motor.

Optionally, the magnetic shield motor is covered with a metallic conductive layer on its side faces and a soft magnetic metallic layer on a surface close to the bulk cylindrical base. As shown in FIG. 14, the magnetic shield motor 2 includes a motor 22 and a non-magnetic long shaft 21 connecting the motor 22 and the bulk cylindrical base 11, and a metallic conductive layer 23 wrapped around the motor 22, and a soft magnetic shield layer 24 located at the non-magnetic long shaft 21 end, where the soft magnetic shield layer 24 is used to shield the rotation magnetic field of the motor 22 from affecting the bulk cylindrical base 11. The bulk cylindrical base is made of a non-magnetic material, including plastic, ceramic, metal, or polymer, etc.; the magnetic tiles and the soft magnetic metallic layer 24 are made of a soft magnetic alloy material, i.e., a high magnetic permeability soft magnetic material containing Co, Fe, Ni and B, Si, C and transition metal Nb, Cu, Zr elements.

Note that the above is only a preferred embodiment of this invention and the technical principles employed. It will be understood by those skilled in the art that this invention is not limited to the particular embodiments described herein, and that various obvious variations, readjustments, combinations, and substitutions can be made by those skilled in the art without departing from the scope of protection of this invention. Therefore, although this invention has been described in some detail by the above embodiments, this invention is not limited to the above embodiments, but may include more other equivalent embodiments without departing from the conception of this invention, and the scope of this invention is determined by the scope of the appended claims.

The invention claimed is:

1. A magnetoresistive magnetic field probe with rotating electromechanical modulator, comprising:
    a bulk cylindrical base, wherein the bulk cylindrical base has a cavity structure and has cylindrical coordinates of $(r(r=R_0), \alpha[0,360°], z[L_0,L_0+L])$, and a center axis of the bulk cylindrical base overlaps with a z-axis of a cylindrical coordinate system, wherein the z-axis of the cylindrical coordinate system corresponds to a z-axis of an xyz coordinate system, wherein r represents a distance from the z-axis, R0 represents a radius to an outer side wall of the bulk cylindrical base, and a represents an included angle between r and the x-axis such that $\alpha[0,360°]$ represents the outer side wall extends from 0 degrees to 360 degrees around the z-axis, and L0 represents a distance in the Z direction from an origin of the xyz coordinate system to a first face of the cylindrical base and L represents a length of the bulk cylindrical base in the Z direction such that L0+L represents the distance from the origin to a second face of the cylindrical base;
    a first magnetic tile and a second magnetic tile attached to an outer side wall of the bulk cylindrical base, wherein each of the first magnetic tile and the second magnetic tile has a surface with a length Ls in the z direction and a thickness Hs and further has a first edge at a first distance L1 from the first face of the cylindrical base and a second edge at a second distance L1+Ls from the first face such that the first magnetic tile has cylindrical coordinates of $(r[R_0,R_0+H_s], \alpha[\Phi,180°-\Phi], z[L_0+L_1, L_0+L_1+L_s])$, and the second magnetic tile has cylindrical coordinates of $(r[R_0,R_0+H_s], \alpha[180°+\Phi,360°-\Phi], z[L_0+L_1, L_0+L_1+L_s])$, $0<\Phi<90°$; and
    a magnetoresistive sensor and a reference signal generator located on the center axis of the bulk cylindrical base, wherein the magnetoresistive sensor has cylindrical coordinates of $(r(r=0), \alpha(\alpha=0), z(z=L_m))$, $L_0+L_1<L_m<L_0+L_1+L_s$, wherein Lm represents a distance from the origin to the magnetoresistive sensor, wherein
    during operation, the bulk cylindrical base rotates about the z-axis at a frequency f, and the first magnetic tile and the second magnetic tile modulate an external magnetic field into a sensed magnetic field having a frequency 2f, and a measurement signal having a frequency 2f is output via the magnetoresistive sensor, and the reference signal generator outputs a reference signal having a frequency 2f, and the reference signal and the measurement signal are demodulated by an external processing circuit to output a magnetic field value so as to provide a measurement of the external magnetic field.

2. The rotating magnetic field probe according to claim 1, wherein a side wall of the bulk cylindrical base has 4 light-incident holes, the 4 light-incident holes have different cylindrical coordinates that are $(r(r=R_0), \alpha(\alpha=\theta,\theta+90°,\theta+180°,\theta+270°), z(z=L_{e1}$ or $z=L_{e2}))$, wherein $L_0<L_{e1}<L_0+L_1$, $L_0+L_1+L_S<L_{e2}<L_0+L$, $0<\theta<90°$;
    the reference signal generator comprises: a light emitting element located outside the outer side wall of the bulk cylindrical base, wherein the light emitting element has cylindrical coordinates of $(r(r=R_0+h_s+h_e), \alpha(\alpha=\theta$ or $\theta+90°$ or $\theta+180°$ or $\theta+270°), z(z=L_{e1}$ or $z=L_{e2}))$; and a photo detector and a logic trigger circuit located on the center axis of the bulk cylindrical base, wherein the photo detector has cylindrical coordinates of $(r(r=0), \alpha(\alpha=0), z(z=L_{e1}$ or $z=L_{e2}))$, wherein
    during operation, the bulk cylindrical base rotates about the z-axis at the frequency f, and when light emitted from the light emitting element is incident into the 4 light-incident holes in sequence, the photo detector detects the incident light from the light emitting element and triggers the logic trigger circuit to output the reference signal having the frequency 2f.

3. The rotating magnetic field probe according to claim 2, further comprising: a circuit board located inside the bulk cylindrical base, wherein the photo detector and the magnetoresistive sensor are located on the circuit board.

4. The rotating magnetic field probe according to claim 2, wherein the reference signal is a high level signal or a low level signal; and when the photo detector does not detect light, the level of the reference signal output by the logic trigger circuit remains unchanged, and when the photo detector detects the incident light from the light emitting element, it triggers the logic trigger circuit so that the level of the reference signal output by the logic trigger circuit is switched.

5. The rotating magnetic field probe according to claim 1, wherein the magnetoresistive sensor is a uniaxial linear sensor or a biaxial linear sensor, wherein the uniaxial linear sensor has magnetic field sensitive direction cylindrical coordinates of (r, $\alpha_1(\alpha_1=\beta$ or $\beta+90°)$, $z(z=L_m))$, and the biaxial linear sensor has magnetic field sensitive direction cylindrical coordinates of (r, $\alpha_2(\alpha_2=\beta)$ and $\alpha_3(\alpha_3=\beta+90°)$, $z(z=Lm))$, $0\leq\beta<270°$.

6. The rotating magnetic field probe according to claim 5, wherein the external processing circuit comprises a capacitor and a phase-locked circuit, the phase-locked circuit comprising a mixer and a low-pass filter, wherein a cut-off frequency of the low-pass filter is less than a rotating frequency of the bulk cylindrical base; and during operation, a measurement signal output by the magnetoresistive sensor is coupled and output to the phase-locked circuit via the capacitor.

7. The rotating magnetic field probe according to claim 6, wherein the external processing circuit further comprises a preamplifier, and the preamplifier is provided between the capacitor and the phase-locked circuit.

8. The rotating magnetic field probe according to claim 6, wherein the external processing circuit further comprises a phase shifter; and the uniaxial linear sensor outputs two measurement signals, wherein one of the measurement signals is directly connected to the phase-locked circuit and the other is phase-shifted by 90 degrees by the phase shifter and then connected to the phase-locked circuit, the reference signal generator generates one reference signal, and the one reference signal and the two measurement signals are demodulated by the phase-locked circuit to output two output signals corresponding to magnetic field components of the external magnetic field.

9. The rotating magnetic field probe according to claim 6, wherein the external processing circuit further comprises a phase shifter; and the uniaxial linear sensor outputs one measurement signal and the reference signal generator generates two reference signals, wherein one of the reference signals is directly connected to the phase-locked circuit and the other is phase-shifted by 90 degrees by the phase shifter and then connected to the phase-locked circuit, and the one measurement signal and the two reference signals are demodulated by the phase-locked circuit to output two output signals corresponding to magnetic field components of the external magnetic field.

10. The rotating magnetic field probe according to claim 6, wherein two measurement signals output from the biaxial linear sensor are separately connected to the phase-locked circuit, the reference signal generator generates one reference signal, and the two measurement signals and the one reference signal are demodulated by the phase-locked circuit to output two output signals corresponding to magnetic field components of the external magnetic field.

11. The rotating magnetic field probe according to claim 1, wherein the bulk cylindrical base is driven to rotate by a magnetic shield motor, and the bulk cylindrical base and the magnetic shield motor are connected to each other by a non-magnetic transmission shaft.

12. The rotating magnetic field probe according to claim 11, wherein the magnetic shield motor is covered with a metallic conductive layer on its side faces and a soft magnetic metallic layer on a surface close to the bulk cylindrical base.

13. The rotating magnetic field probe according to claim 12, wherein the bulk cylindrical base is made of a non-magnetic material; and the first magnetic tile, the second magnetic tile, and the soft magnetic metallic layer are all made of soft magnetic alloy materials.

* * * * *

UNITED STATES PATENT AND TRADEMARK OFFICE
CERTIFICATE OF CORRECTION

PATENT NO. : 12,270,871 B2  
APPLICATION NO. : 17/997626  
DATED : April 8, 2025  
INVENTOR(S) : Deak et al.

Page 1 of 1

It is certified that error appears in the above-identified patent and that said Letters Patent is hereby corrected as shown below:

In the Claims

In Column 12, Line 5, in Claim 1, delete "R0" and insert --$R_0$-- therefor

In Column 12, Line 6, in Claim 1, delete "a" and insert --$\alpha$-- therefor

In Column 12, Line 9, in Claim 1, delete "L0" and insert --$L_0$-- therefor

In Column 12, Line 13, in Claim 1, delete "L0+L" and insert --$L_0+L$-- therefor In Column 12, Line 20, in Claim 1, delete "Ls" and insert --$L_s$-- therefor In Column 12, Line 21, in Claim 1, delete "Hs" and insert --$H_s$-- therefor In Column 12, Line 22, in Claim 1, delete "L1" and insert --$L_1$-- therefor In Column 12, Line 23, in Claim 1, delete "L1+Ls" and insert --$L_1+L_s$-- therefor Signed and Sealed this  
Seventeenth Day of June, 2025

Coke Morgan Stewart  
*Acting Director of the United States Patent and Trademark Office*